United States Patent
Burggraf

(10) Patent No.: US 12,087,726 B2
(45) Date of Patent: Sep. 10, 2024

(54) DEVICE AND METHOD FOR JOINING SUBSTRATES

(71) Applicant: EV Group E. Thallner GmbH, St. Florian am Inn (AT)

(72) Inventor: Jürgen Burggraf, Schärding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 17/642,046

(22) PCT Filed: Nov. 8, 2019

(86) PCT No.: PCT/EP2019/080718
§ 371 (c)(1),
(2) Date: Mar. 10, 2022

(87) PCT Pub. No.: WO2021/089173
PCT Pub. Date: May 14, 2021

(65) Prior Publication Data
US 2024/0047414 A1 Feb. 8, 2024

(51) Int. Cl.
*H01L 21/00* (2006.01)
*H01L 21/67* (2006.01)
*H01L 23/00* (2006.01)

(52) U.S. Cl.
CPC ........ *H01L 24/80* (2013.01); *H01L 21/67121* (2013.01); *H01L 2224/80091* (2013.01);
(Continued)

(58) Field of Classification Search
CPC .............. H01L 24/80; H01L 21/67121; H01L 2224/80091; H01L 2224/80895;
(Continued)

(56) References Cited

U.S. PATENT DOCUMENTS

| | | | | |
|---|---|---|---|---|
| 5,129,827 | A * | 7/1992 | Hoshi | H01L 21/67092 257/E21.705 |
| 9,296,193 | B2 * | 3/2016 | Burggraf | B32B 43/006 |
| 9,390,956 | B2 * | 7/2016 | Burggraf | H05K 1/0213 |
| 2006/0205179 | A1 | 9/2006 | Fournel et al. | |
| 2007/0274669 | A1 | 11/2007 | Chen et al. | |

(Continued)

FOREIGN PATENT DOCUMENTS

| | | | |
|---|---|---|---|
| JP | H-032228 B2 * | 1/1991 | |
| JP | 2002014359 A * | 1/2002 | |

(Continued)

OTHER PUBLICATIONS

International Search Report from corresponding International Patent Application No. PCT/EP19/80718, dated Jul. 14, 2020.
Office Action of Jan. 4, 2024 in related/corresponding Japanese Patent Application No. 2022-523348.
(Continued)

*Primary Examiner* — Niki H Nguyen
(74) *Attorney, Agent, or Firm* — KUSNER & JAFFE

(57) ABSTRACT

A method and device for bonding a first substrate to a second substrate at contact surfaces of the substrates.
The method includes the following steps: mounting the first substrate on a first mounting surface of a first substrate holder and mounting the second substrate on a second mounting surface of a second substrate holder, wherein the substrate holders are arranged in a chamber;
  contacting the contact surfaces at a bond initiation surface; and
  bonding the first substrate to the second substrate from the bond initiation surface to the centre of the substrates.

12 Claims, 4 Drawing Sheets

(52) U.S. Cl.
CPC ............... *H01L 2224/80895* (2013.01); *H01L 2224/80896* (2013.01)

(58) Field of Classification Search
CPC ..... H01L 2224/80896; H01L 21/67092; H01L 21/67742; H01L 21/67745; H01L 21/6833; H01L 21/67109; H01L 21/3065; H01L 21/68785; H01L 21/67248; H01L 2924/0002; H01L 21/67069; H01L 24/13; H01L 21/67011; H01L 21/67126; H01L 2221/68327; H01L 2224/94; H01L 21/2007; H01L 21/67196; H01L 2224/73204; H01L 2224/75252; H01L 2224/80132; H01L 23/3135; H01L 23/5384; H01L 24/73; H01L 21/02021; H01L 21/0262; H01L 21/52; H01L 21/67769; H01L 21/68764; H01L 21/78; H01L 2224/48091; H01L 2224/75272; H01L 2224/757; H01L 2224/75701; H01L 2224/75704; H01L 2224/75745; H01L 2224/75901; H01L 2224/75981
See application file for complete search history.

(56) References Cited

U.S. PATENT DOCUMENTS

| | | | |
|---|---|---|---|
| 2012/0186741 A1* | 7/2012 | Lake | B32B 38/1866 |
| | | | 156/580 |
| 2014/0072774 A1 | 3/2014 | Kito et al. | |
| 2019/0019678 A1 | 1/2019 | Wagenleitner et al. | |
| 2019/0214260 A1 | 7/2019 | Francis | |
| 2020/0381283 A1* | 12/2020 | Huang | H01L 21/67092 |

FOREIGN PATENT DOCUMENTS

| | | | |
|---|---|---|---|
| JP | 2006-509377 | * | 3/2006 |
| JP | 2019-509627 | A | 4/2019 |
| WO | WO2017/162272 | A1 | 9/2017 |
| WO | WO2018/143344 | A1 | 8/2018 |

OTHER PUBLICATIONS

Office Action (with English translation) dated Feb. 4, 2024 from related/corresponding Korean Patent Application No. 10-2022-7006575.

* cited by examiner

DEVICE AND METHOD FOR JOINING SUBSTRATES

FIELD OF THE INVENTION

The present invention relates to a method for Bonding a first substrate to a second substrate and a corresponding device according to the coordinate claims.

BACKGROUND OF INVENTION

In the prior art, a great many methods exist in order to bond two substrates to one another. Independently of the fundamental bonding process, it is almost always the case that at least one first substrate is convexly curved and centrally brought into contact with a second substrate. The whole-surface bond then comes about due to a continuous contacting from the centre to the edge of the substrates. This type of contacting is found again in the case of fusion and metal bonding, but also in the case of temporary bonding. Other options for contacting exist, particularly in the case of the fixing of a substrate on a film. Thus, a film is very often laminated onto a substrate. In this case, the contacting process predominantly takes place by means of a manipulation of the film. The substrate is fixed and held flat in this case. A special device, what is known as a laminator, subsequently pulls a film over the substrate. The film may be fixed on the substrate by means of mechanical elements, particularly rollers, or simply only by lowering.

SUMMARY OF INVENTION

It is the object of the present invention to provide a device and a method for bonding two substrates, using which the bonding accuracy is increased.

The present object is achieved using the features of the independent claims. Advantageous developments of the invention are specified in the dependent claims. All combinations of at least two features specified in the description, the claims and/or the drawings also fall within the scope of the invention. When value ranges are given, values lying inside the limits mentioned should also be considered as disclosed as limit values and claimable in any desired combination.

The invention relates to a method for bonding a first substrate to a second substrate at contact surfaces of the substrates, with the following steps, particularly the following procedure:

mounting the first substrate on a first mounting surface of a first substrate holder and mounting the second substrate on a second mounting surface of a second substrate holder, wherein the substrate holders are arranged in a chamber, which can be closed in a vacuum-tight manner in particular, contacting the contact surfaces at an, in particular annular, bond initiation surface, bonding the first substrate to the second substrate from the bond initiation surface to the centre of the substrates.

It is preferably provided, that after contacting and/or during bonding, a chamber pressure in the chamber is increased.

In development of the invention, it is provided, that the bond initiation surface is arranged at the circumferential edge of at least one of the contact surfaces.

It is further preferably provided that, prior to contacting, a concave deformation of the first substrate takes place with respect to the second substrate, particularly by mounting the first substrate on the correspondingly concavely curved first mounting surface.

According to a further aspect of the invention, it is provided that the, particularly closed-circumference, bond initiation surface is constructed to run in an annular, particularly circular manner, preferably concentrically to the centre of the substrates.

An embodiment of the invention is particularly advantageous, in which the first substrate and/or the second substrate are fixed at the rear on the first and/or second mounting surfaces, exclusively in the region of side edges of the contact surfaces.

The invention relates to a device for bonding a first substrate to a second substrate at contact surfaces of the substrates, having:

a first mounting surface of a first substrate holder (10) for mounting the first substrate, a second mounting surface of a second substrate holder for mounting the second substrate, a chamber, which can be closed in a vacuum-tight manner in particular, and in which the substrate holders are arranged, means for contacting the contact surfaces at an, in particular annular, bond initiation surface, means for bonding the first substrate to the second substrate from the bond initiation surface to the centre of the substrates.

The invention is based on the idea that bonding of the substrates takes place from an annular bond initiation surface to a centre of the contact surfaces. Preferably, at least one of the two substrates, preferably the second and/or upper substrate, is concavely deformed with respect to the other substrate prior to contacting, for aligning the contact surfaces. Deformation in particular means a state deviating from an initial state, particularly initial geometry, of the substrates. The bonding is preferably initiated after contacting the contact surfaces, particularly by dropping/releasing the first/upper substrate, preferably supported by means of a pressure increase. Corresponding bonding means are provided in accordance with the device.

One, in particular independent, aspect of the invention relates to a method and a device for bonding/laminating a second substrate, particularly wafers, to a second substrate, particularly another wafer or a film. The second substrate can also be termed a support in particular. In this case, the idea is based on the thought of fixing the substrate in a concave shape on a concavely shaped substrate holder, concavely contacting, particularly prefixing, with a different substrate at a bond initiation surface and subsequently utilizing a pressure difference for generating a homogeneous pressure on the surface of the substrate to be bonded, in order to create the whole-surface bond. The pressure difference is generated between a cavity formed by the contacted contact surfaces of the substrates and the chamber space. It is also conceivable that the substrate holder can curve its surface, particularly concavely, by means of control elements.

A homogeneous pressure distribution advantageously ensures a uniform contact force of the second substrate onto the first substrate, as due to the use of a homogeneous pressure, a uniform application of pressure takes place over the entire surface of the substrate. Furthermore, a pressure difference, which can easily be generated, can be used and it is possible to dispense with the use of pins or other mechanical elements which only act with a local force.

A further aspect of the invention includes the use of an isostatic pressure, in order to fix one, particularly rigid, substrate on a different substrate, which may also be rigid. The substrate to be fixed is in this case curved in a concave manner prior to generating the pressure difference and therefore only rests by way of the boundary surface (bond initiation surface). The idea according to the invention is not only limited to the bonding or laminating of a film to a substrate, but rather preferably relates to two, in particular rigid, substrates. The idea according to the invention can in particular also be used for fusion or metal bonding. Preferably, the method according to the invention and the device according to the invention are used for the temporary bonding, however. The thickness of a film used according to the invention lies between 1 µm and 4000 µm, preferably between 1 µm and 3500 µm, more preferably between 1 µm and 3000 µm, most preferably between 1 µm and 2500 µm, most preferably of all between 1 µm and 2000 µm.

Substrates

Different types of substrates are mentioned, wherein (particularly structured) wafers, particularly with an adhesive layer, and frames with film come into question. Substrates of this type are known per se to the person skilled in the art. The substrates may have an adhesive layer. The thickness of the adhesive layer lies between 1 µm and 250 µm, preferably between 2 µm and 200 µm, more preferably between 3 µm and 100 µm, most preferably between 3 µm and 50 µm, most preferably of all between 3 µm and 10 µm.

Substrate Holder

Substrate holders with a planar mounting surface or a concavely curved mounting surface in particular come into question as substrate holders. The substrate holders preferably have fixings for retaining/fixing/mounting the substrates. The fixings may in particular be 1. mechanical fixings, particularly clamps, and/or
2. vacuum fixings, particularly with individually controllable and/or mutually connected vacuum tracks, and/or
3. electrical fixings, particularly electrostatic fixings, and/or
4. magnetic fixings, and/or
5. adhesive fixings, particularly Gel-Pak fixings, and/or
6. fixings with adhesive, in particular controllable, surfaces.

The fixings are, in particular, electronically controllable. Vacuum fixing is the preferred fixing type.

Vacuum fixing preferably includes a plurality of vacuum tracks, which emerge at the surface of the sample holder (mounting surface). The vacuum tracks are preferably individually controllable. In a use, which is more realizable from a technical standpoint, some vacuum tracks are combined to form vacuum track segments, which can be controlled individually, therefore evacuated or flooded. However, each vacuum segment is independent of the other vacuum segments. Thus, one is afforded the option of building individually controllable vacuum segments. The vacuum segments are preferably of annular construction. As a result, a targeted, radially symmetrical fixing, carried out from the inside outwards in particular, and/or release of a substrate from the substrate holder or vice versa is enabled. Vacuum segment designs of this type are disclosed in the published document WO2017162272A1.

The substrate holders may be transparent for part of the electromagnetic spectrum, particularly for UV light and/or visible light and/or infrared light, at well-defined positions or over the entire volume. It is also conceivable that the substrate holders have openings, particularly holes, most preferably bores, at a plurality of positions, through which a clear view onto the substrate fixing side can be ensured. The view onto alignment marks, which may be located on the substrates, is in particular ensured by means of these constructional measures.

In the rest of the text, the preferred substrate holders according to the invention are explained more precisely.

These particularly have concavely curved mounting surfaces. The curvature of the concave mounting surface is preferably constant and/or rotationally symmetrical. In particular, the curvature of the concave mounting surface can be described by a radius of curvature. The radius of curvature is the radius of the osculating circle at and through the centre of the concave mounting surface. The radius of curvature lies between 10 mm and $10^8$ mm, preferably between $10^3$ mm and $10^8$ mm, more preferably between $10^4$ mm and $10^8$ mm, most preferably between $10^3$ mm and $10^8$ mm, most preferably of all between $10^6$ mm and $10^8$ mm. For special embodiments, it is conceivable that the curvature of the concave mounting surface is not constant, but rather changes from the centre towards the edge, particularly continuously. In this particular embodiment, a different radius of curvature would be provided at each point on the mounting surface.

In a first embodiment of the concave mounting surface, the curvature is the same, i.e. homogeneous, at each position.

In a second embodiment of the concave mounting surface, the curvature would be constant, at least along a circle, i.e. would only change from the centre towards the edge. The curvature would be correspondingly radially symmetrical.

In a third embodiment of the concave mounting surface, the curvature is anisotropic, i.e. dependent on the radial position and the direction. In this special embodiment, it would for example be possible to fix a first substrate in such a manner that, upon contact with a planar second substrate, the first substrate does not rest fully along the extensive side edge of its contact surface, but rather only parts of the circumference of the side edge contact the second substrate. One example for such an embodiment would be a saddle deposited on a planar surface. This embodiment according to the invention particularly allows the evacuation of the intermediate space of two substrates, which are contacted with one another, after the contact has taken place.

Furthermore, the substrate holders according to the invention can be characterized with respect to the deformability of the concave mounting surface.

In a first embodiment according to the invention, the substrate holder according to the invention is provided with a static, concave mounting surface. The concave mounting surface is in particular produced by milling and/or grinding and/or polishing processes. Also conceivable is production by means of a rotational process, in which a curable liquid is set rotating in a cylinder and cured, so that a concavely curved mounting surface is formed during curing.

In a second embodiment according to the invention, the substrate holder according to the invention is provided with a dynamically changeable, concave mounting surface. As the deformation of the concave mounting surface takes place in relatively small dimensions, particularly in the micrometre to millimetre range, the use of functional materials is conceivable. In particular magnetorheological materials and/or
electrorheological materials and/or
shape-memory alloys and/or
Gel-Paks and/or
mechanical components and/or
electrical components and/or
magnetic components could be used for adapting the concave curvature.

Furthermore, the substrate holders according to the invention may be characterized with respect to further functional properties, which are described in the following on the basis of embodiments of the invention.

According to a first embodiment according to the invention, the substrate holder is, preferably entirely, opaque (i.e. non-transparent) for an electromagnetic radiation provided for measuring substrate surfaces. The measurement takes place in particular for controlling the substrate holders during the alignment of the substrates with respect to one another.

In a second embodiment according to the invention, the substrate holder is, particularly partially, preferably completely, transparent for the electromagnetic radiation provided for measuring substrate surfaces. The transparency may also only relate to sections of the substrate holder.

The transparency is described by the transmittance, which specifies the ratio of transmitted and irradiated radiation. The transmittance is not dependent on the thicknesses of the irradiated body, however, and is not therefore a material-specific property. The values of the transmittance are therefore specified with reference to a unit length of 1 cm. The material of the transparent parts of the substrate holder in particular has a transmittance of greater than 10%, preferably greater than 20%, more preferably greater than 50%, most preferably greater than 75% and most preferably of all greater than 99% in relation to the chosen thickness of 1 cm and for the respectively chosen wavelength.

In a third embodiment according to the invention, the substrate holder is provided with openings, particularly bores, through which, observation of a substrate or substrate stack is made possible.

In a fourth embodiment according to the invention, the substrate holder is constructed in such a manner that the concave mounting surface is created from a layer or a component which is able to adjust itself dynamically, particularly by a change in volume. An embodiment of this type is primarily suitable for the construction of a substrate holder according to the invention with dynamically changeable mounting surface.

In a fifth embodiment according to the invention, the substrate holder is constructed in such a manner that the concave mounting surface can be curved by control means, particularly mechanical and/or fluid dynamic and/or electrical control means. The elasticity of the component which forms the concave mounting surface is utilized in this case. As the radii of curvature of the concave mounting surfaces according to the invention are very large, i.e. the flexure thereof is very small, a minimal translational displacement of the component connected to the control means is sufficient in order to effect a change in curvature. The control means are controlled by means of a control for adjusting the curvature in particular.

Installation (Device)

The invention comprises an installation, comprised of at least two substrate holders in a chamber, which is closable in a pressure-tight manner in particular.

At least one of the substrate holders can be fixed and/or rotated and/or translationally moved. The rotation takes place in particular about at least one axis, preferably three axes, which are orthogonal to one another. The translation takes place in particular along at least one axis, preferably along three axes, which are orthogonal to one another. The installation preferably has means for coarse and/or fine adjustment of the substrates with respect to one another.

The means for coarse adjustment are preferably mechanical stop elements which limit the freedom of translational movement of a substrate. For example, pins are conceivable, towards which a substrate is moved until there is contact.

The means for fine adjustment are preferably optical elements, particularly optical elements which are able to detect alignment marks which are preferably located on the substrate. The detected alignment marks are recorded by a camera and processed with the aid of soft- and/or hard- and/or firmware. The control of the fine adjustment (alignment) hereby takes place by means of the control device.

The resolution of the optical elements is better than 100 µm, preferably better than 10 µm, more preferably better than 1 µm, most preferably better than 500 nm, most preferably of all better than 50 nm.

The chamber can be evacuated completely and flooded with a desired gas mixture or an individual gas. The temperature of the chamber and/or the substrate holders according to the invention can be controlled, i.e. the chamber and/or the substrate holders are heat- and/or coolable. The temperature of the chamber and/or the substrate holders can in particular be controlled to a temperature between −75° C. and 300° C., preferably between −50° C. and 250° C., more preferably between −25° C. and 200° C., most preferably between 0° C. and 150° C., most preferably of all between 25° C. and 100° C.

Method

In a first process step according to the invention of a first process according to the invention, a first substrate is loaded onto the first substrate holder according to the invention. The mounting surface of the first substrate holder is concavely curved in particular, so that the first substrate to be mounted on the mounting surface is likewise concavely curved by means of mounting on the mounting surface. In particular, at the same time, a second substrate is loaded and fixed on a second mounting surface of a second substrate holder. In particular, the second substrate holder may be designed identically to the first substrate holder. Preferably, however, the second substrate holder is a substrate holder with a planar mounting surface. The mounting of the second substrate can take place before, during or after the mounting of the first substrate.

In a second process step, an alignment of the first substrate relative to the second substrate takes place. The alignment may take place mechanically and/or optically in particular, in this case. If the alignment is only a coarse alignment process, which is used in particular in a temporary bonding process, the alignment preferably takes place purely mechanically. Preferably, however, the two substrates are aligned with respect to one another by means of alignment marks, particularly with the aid of optical means.

At the latest in a third process step according to the invention of a first process according to the invention, an at least partial evacuation of the chamber, in which the two substrate holders and substrates are located, takes place. This process step may already take place before and/or during the mounting and/or alignment of the substrates. By evacuating the chamber, it is ensured that no molecules and/or atoms are located between the two substrates or deposited on the same. Particularly in the case of a non-closed-circumference annular contacting (bond initiation surface), the evacuation may also still take place after the contacting, particularly in a continuously sustained manner. Preferably the annular contacting of both substrates takes place fully, particularly at the edge of the substrates. Consequently, the evacuation is preferably carried out before this process step of contacting.

The pressure in the chamber is particularly reduced (evacuation) to less than 1 bar, preferably less than $10^{-2}$ mbar, more preferably less than $10^{-4}$ mbar, most preferably less than $10^{-6}$ mbar, most preferably of all less than $10^{-8}$ mbar. This makes sure in particular that no atoms or molecules are located between the substrates if a whole-surface contacting of the two substrates takes place by means of further process steps according to the invention, as the atoms and molecules between the substrates no longer have the possibility of leaving the intermediate space after annular closed-circumference contacting. The intermediate space would namely then be hermetically closed off with the contacting along the bond initiation surface.

If the process according to the invention is used for fusion bonding of two substrates, the enclosed atoms and molecules could create gas bubbles between the substrates, which would make the substrate stack virtually unusable. If the method according to the invention is used for temporary bonding with adhesives, by contrast, a small quantity of gases between the substrates can be tolerated, as the adhesives used can accommodate a certain quantity of gases.

In another embodiment according to the invention, the process according to the invention is used for hybrid bonding. Hybrid bonding is a fusion bond between two hybrid surfaces. A hybrid surface is a surface, which is comprised of electric and dielectric regions. The electric regions are preferably contacts of functional components produced under the dielectric layer. The electric regions are then also termed through-silicon vias (TSVs). The surfaces of the electric regions are preferably recessed a little in relation to the surfaces of the dielectric regions.

The height difference between the surfaces of the electric and dielectric regions in this case is less than 1 µm, preferably less than 500 nm, more preferably less than 50 nm, most preferably less than 5 nm, most preferably of all less than 1 nm. Due to the preferably recessed electric regions, the bond wave of a fusion bond can readily move over the dielectric regions, without being hindered in its progress by the electric regions.

After the fusion bond over the dielectric regions, the substrate stack is heat treated. The heat treatment preferably means that mutually opposite electric regions of both substrates expand to such an extent owing to the thermal loading, that they contact one another and are permanently bonded to one another by means of a metal bond, particularly a metal diffusion bond. Hybrid bonds therefore have the advantage that the bonding of two substrates can be produced by means of a fusion process very easily and cost effectively.

The method according to the invention in particular advantageously shows a possibility for forming such a hybrid bond. Advantageously, in the process according to the invention, bonding of the two substrates is carried out, preferably under a vacuum, at the periphery. Advantageously, after the, in particular full, peripheral, contacting of both substrates, gas is no longer located between the substrates. Due to the removal of the gas between the substrates, one possible influential factor, which could influence a progressive bond wave, ceases to exist. The dome shape of the, in particular, upper substrate, which is convexly shaped when viewed from outside, is stabilized exclusively by its elastic property and its peripheral fixing to the second substrate.

Due to the pressure increase, a targeted and, above all, controllable flattening of the curved substrate is then possible without having to take a resistance of a gas between the substrates into account. The bond wave then advantageously runs from the periphery to the centre.

In a fourth process step, a relative convergence of the two substrates with respect to one another takes place, which is preferably ended after the contact of the first, concavely curved substrate with the second substrate along the bond initiation surface. It is also conceivable, if also less preferred, that the relative movement between both substrates is ended even before the contacting thereof. In this case, the fixing of the upper substrate holder is released and the upper substrate falls over a relatively short stretch of a few millimetres, preferably a few micrometres, more preferably a few nanometres, onto the lower substrate. After the upper substrate, which is concavely curved according to the invention, touches the lower substrate along its periphery, both substrates are prefixed along the periphery by means of surface mechanisms.

In a fifth process step, the increase of the pressure takes place in the chamber. In particular, a valve is opened to the atmosphere, so that atmospheric pressure is set again inside the chamber. It is also conceivable, however, that a gas or a gas mixture is introduced into the chamber, which preferably includes inert gas atoms or inert gas molecules. By generating an increased pressure, particularly by means of a compressor, the concavely curved substrate, is continuously, preferably suddenly, pressed flat, as a pressure difference is built between the chamber space and the cavity separated from the chamber space by the contact between the substrates.

By letting in a gas or a gas mixture in a controlled and slow manner, the curved substrate can in particular also be flattened in a controlled and very slow manner.

In a certain extension according to the invention, during the controlled and slow flattening of the curved substrate, a continuous monitoring of the curved substrate and/or the entire substrate stack and/or the intermediate space of the two substrates can be carried out. Preferably, in particular, monitoring of the alignment accuracy between individual features of both substrates is carried out. According to the invention, it is in particular conceivable that a defective alignment is determined, even during the flattening of the curved substrate, and the process is subsequently interrupted. The upper, still curved substrate is, in this case, preferably fixed again by the substrate holder according to the invention and removed from the lower substrate. Thereupon, in the device according to the invention, a renewed, improved alignment can take place between the two substrates.

In the process step according to the invention, the edge of the concavely curved substrate migrates continuously radially outwards, whilst the centre of the first substrate moves closer to the second substrate. In particular, the contact between the two substrates is constantly maintained during the process step according to the invention, so that no contaminants get between the substrates.

This process also takes place if the contacting of the first substrate with the second substrate has not taken place fully.

The previously described process can be modified and differs only in terms of a few points which are described in the following.

In the third process step, in contrast to the previously described process, no evacuation of the chamber is carried out. In particular, the chamber remains open to the atmosphere.

For this, in the fifth process step, an overpressure in relation to the external atmosphere, is applied in the chamber. In particular, the chamber is locked hermetically (in a pressure tight manner) to this end. It is also conceivable, however that the chamber is open to the atmosphere via valves, wherein an overpressure is generated in the chamber by a high volumetric flow.

Features disclosed according to the device should also be considered as disclosed according to the method and vice versa.

Further advantages, features and details of the invention result from the following description of preferred exemplary embodiments, as well as on the basis of the drawings.

BRIEF DESCRIPTION OF DRAWINGS

In the figures, the same components or components with the same function are labelled with the same reference numbers.

All figures are not drawn to scale, in order to simplify the illustration and to facilitate understanding. In particular, the curvatures of the substrates are illustrated too large.

DETAILED DESCRIPTION OF INVENTION

Figure 1A:
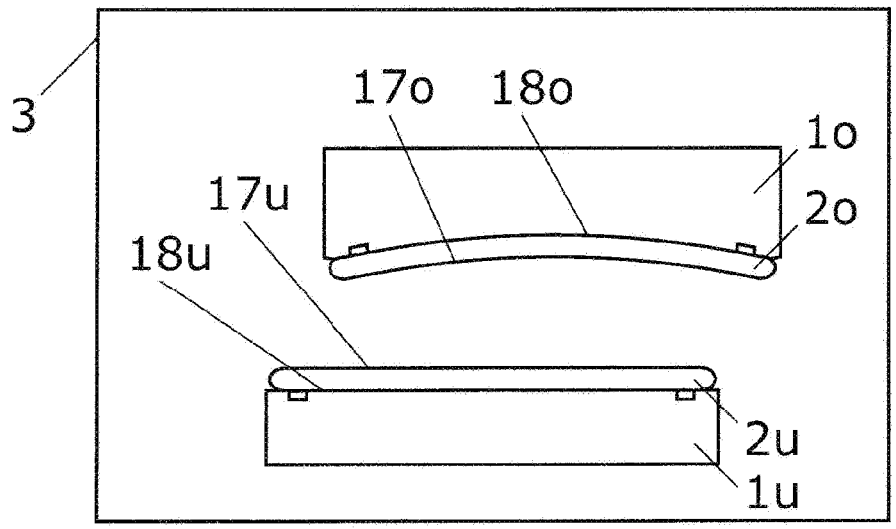
FIG. 1a shows a first process step of an embodiment of the method according to the invention.

FIG. 1a shows a first process step, in which a first substrate 2o has been loaded onto a first mounting surface 18o of a first substrate holder 1o and fixed. In particular, at the same time, the fixing of a second substrate 2u onto a second mounting surface 18u of a second substrate holder 1u takes place. The fixing of both substrates 2u, 2o preferably takes place inside a chamber 3. It would also be conceivable, however, that the substrate 2u and/or the substrate 2o are fixed on a substrate holder outside the chamber 3 and then transported with the substrate holder into the chamber 3.

Figure 1B:
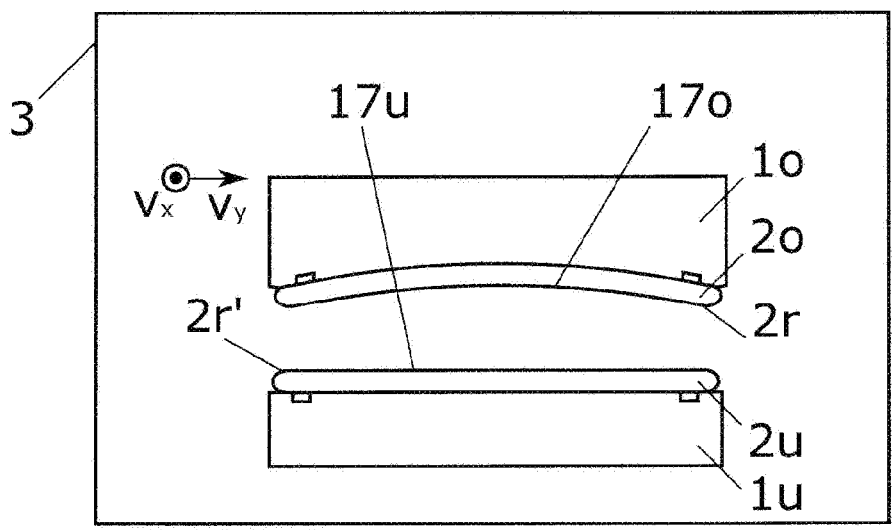
FIG. 1b shows a second process step of the embodiment according to FIG. 1a, FIG. 1c shows a third process step of the embodiment according to FIG. 1a, FIG. 1d shows a fourth process step of the embodiment according to FIG. 1a, FIG. 1e shows a fifth process step of the embodiment according to FIG. 1a, FIG. 1f shows a sixth process step of the embodiment according to FIG. 1a, FIG. 2 shows a first embodiment of a substrate holder according to the invention.

FIG. 1b shows a second process step, in which an alignment of the two substrates 2u, 2o with respect to one another takes place, particularly an alignment of the contact surfaces 17u, 17o thereof. The alignment may be a coarse and/or a fine alignment. Fine alignment preferably takes place by means of alignment marks (not illustrated, as known per se) and optical elements 9. The alignment preferably takes place in the x and/or y direction (speeds $v_x$, $v_y$) and/or in the direction of rotation of the substrates 2u, 2o. The curvature of the upper substrate 2o is illustrated in a very exaggerated manner in the figure. For an optical alignment of the two substrates 2u, 2o with respect to one another, the contact surfaces 17u, 17o may be considered as more or less parallel to one another.

Figure 1C:
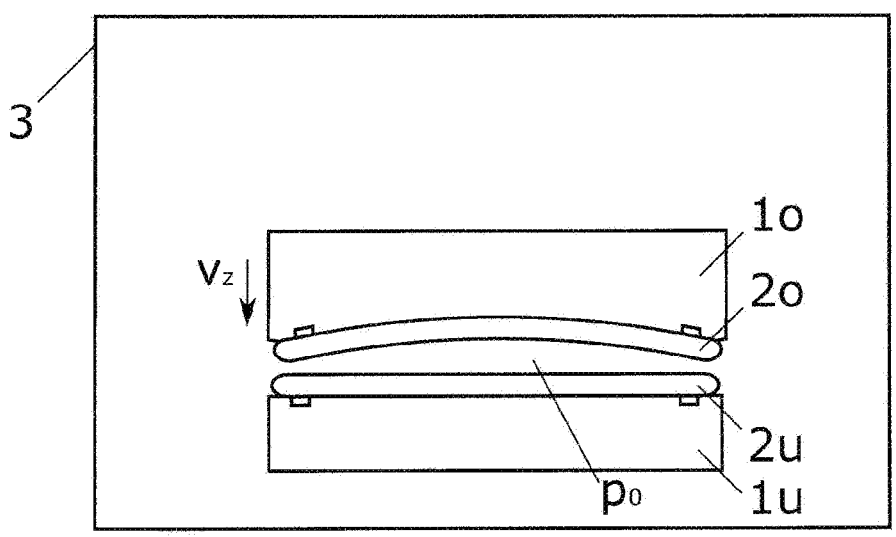

FIG. 1c shows a third process step, in which a relative convergence of the two substrates 2u, 2o takes place, particularly by means of the relative movement of the two substrate holders 1u, 1o with respect to one another (speed $v_z$). At the latest, in this process step, an evacuation of the chamber 3 begins, which generates a lowest possible chamber pressure p inside the chamber 3. The generation of the vacuum may however begin even before the third process step and is finished before the substrates 2u, 2o contact (FIG. 1d).

Figure 1D:
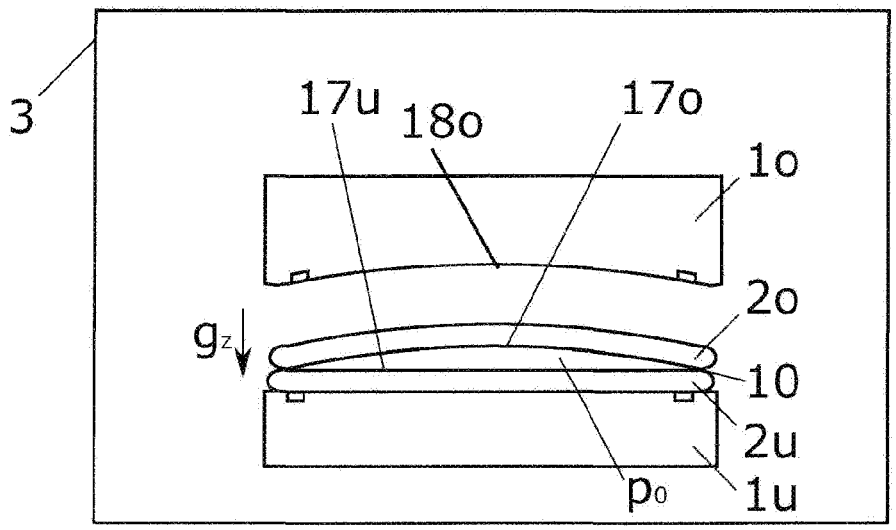

FIG. 1d shows a fourth process step, in which the concavely curved first substrate 2o is fixed on the second substrate 2u. If the first, concavely curved substrate 2o is located on an upper substrate holder 1o, the first substrate 2o can either contact the second substrate 2u by convergence until contacting or by dropping. Preferably, the contacting takes place initially at a bond initiation surface 10 exclusively. The bond initiation surface 10 is formed by the contact surfaces, between 17u and 17o, of the substrates 2u, 2o at the start of the contacting of the substrates 2u, 2o. The contacting takes place initially along the side edges 2r, 2r' of the contact surfaces 17u, 17o, particularly fully.

Figure 1E:
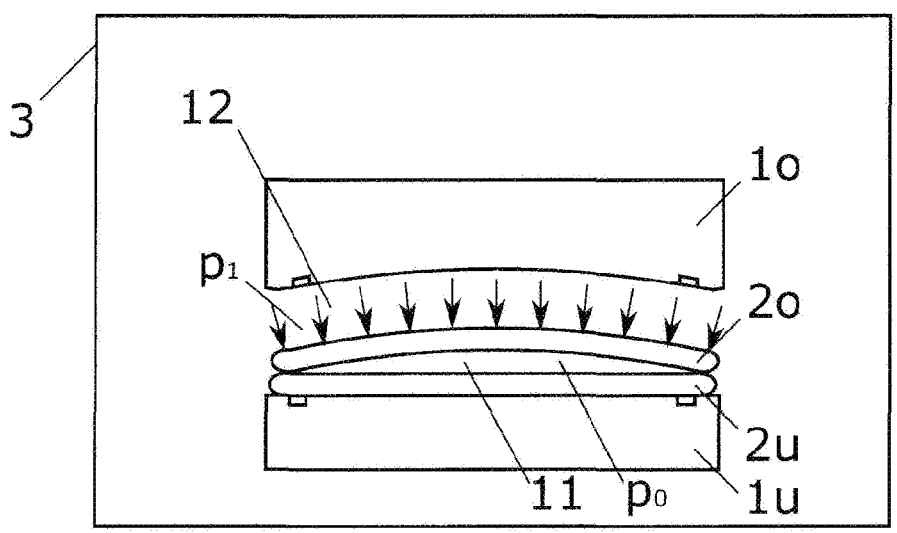

FIG. 1e shows a fifth process step, in which the chamber pressure p1 in the chamber 3 is set to be greater than the chamber pressure p0 prevailing directly prior to contacting. Due to the pressure difference, thus created, between a cavity 11, formed by the concave deformation of the first substrate 2o, and the chamber space 12 lying outside the substrates 2u, 2o, an, in particular isotropic, pressure acts on the exposed first substrate 2o and presses it onto the second substrate 2u supported by the second substrate holder.

Figure 1F:
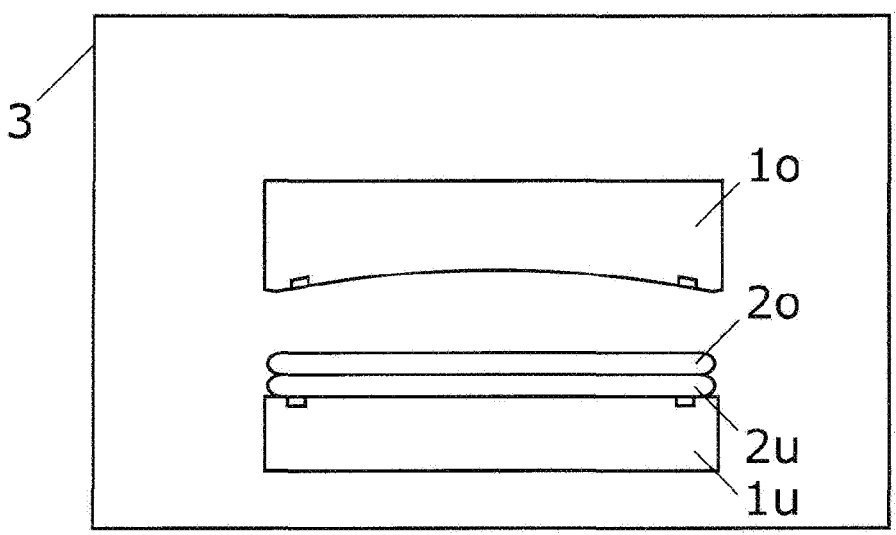

FIG. 1f shows a sixth process step, in which the connection, particularly the bond, between the first substrate 2o and the second substrate 2u is produced.

In the rest of the text, individual embodiments of first substrate holders 1o, 1o', 1o", 1o''', 1o'''' are described. Preferably, the first substrate holders 1o, 1o', 1o", 1o''', 1o'''' according to the invention are comprised of a plurality of components. The substrate holders 1o, 1o', 1o", 1o''', 1o'''' shown are illustrated schematically with the minimum necessary number of components which are important for the illustration of the functions according to the invention. Otherwise, the substrate holders 1o, 1o', 1o", 1o''', 1o'''' may have conventional features, which are not illustrated here.

Figure 2:
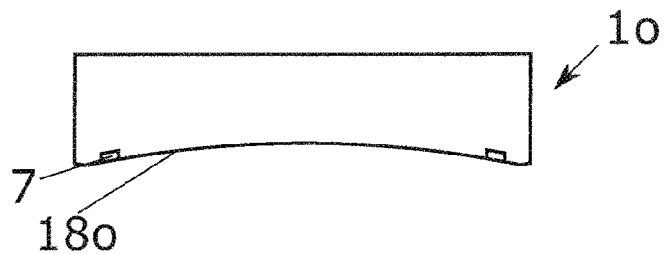

FIG. 2 shows a first embodiment of the first substrate holder 1o, which is solid. The substrate holder 1o is particularly impermeable for electromagnetic radiation from the UV, the visible and the infrared range. The substrate holder 1o has fixings 7 for fixing the first substrate 2o on the static, concave mounting surface 18o.

Figure 3:
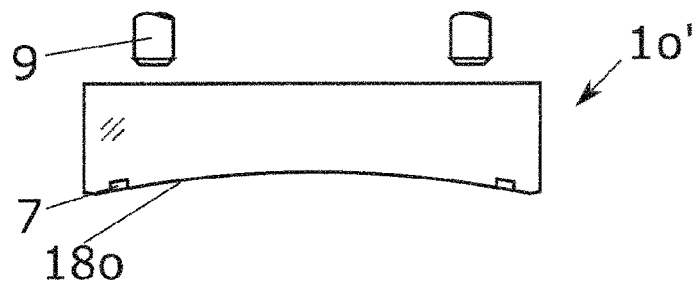
FIG. 3 shows a second embodiment of a substrate holder according to the invention.

FIG. 3 shows a second embodiment of a substrate holder 1o', which is transparent. Due to the transparency, features, particularly alignment marks, on the substrate can be recognized and/or measured through the substrate holder 1o' by means of the optical elements 9.

Figure 4:
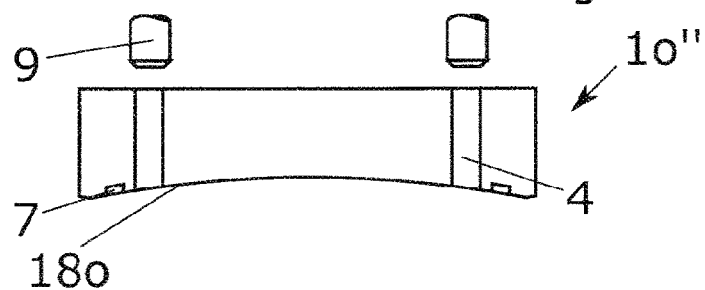
FIG. 4 shows a third embodiment of a substrate holder according to the invention.

FIG. 4 shows a third embodiment of a substrate holder 1o", which has bores 4, through which features of the substrate 2o fixed on the substrate holder 1o" can be recognized and/or measured by means of the optical elements 9.

Figure 5:
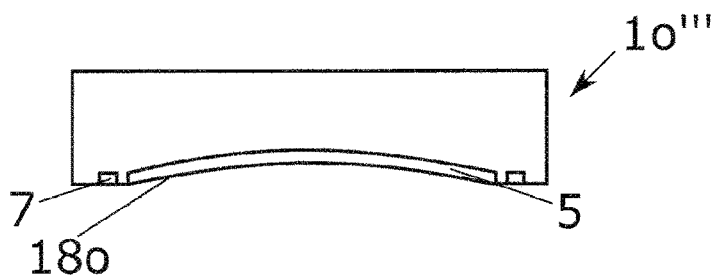
FIG. 5 shows a fourth embodiment of a substrate holder according to the invention.

FIG. 5 shows a fourth embodiment of a substrate holder 1o''', which has a material layer 5, which can be, in particular electrically and/or magnetically and/or thermally, connected such that a volume contraction or volume expansion occurs. This volume change takes place predominantly in the cubic micrometre to cubic millimetre range. In spite of the small volume change, the concave mounting surface may be changed as a result.

The material layer 5 may for example be a magnetorheological, electrorheological or a shape-memory alloy. Shape-memory alloys in particular are able to change the volume and thus the shape of the concave mounting surface 18o due to a thermal induced phase transformation. If the material layer 5 is a magnetorheological or electrorheological material layer 5, corresponding electronic and/or electrotechnical components must be provided in the substrate holder 1o''', in order to be able to generate magnetic or electric fields, which lead to a change of the volume of the concave mounting surface 18o due to physical influencing of the material layer 5. These components are not drawn in for reasons of clarity. These are coils or electrodes in particular.

Figure 6:
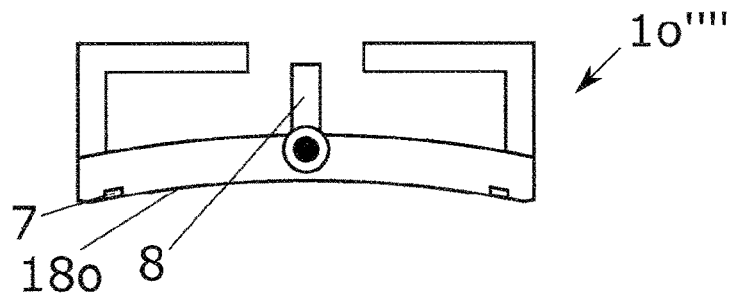
FIG. 6 shows a fifth embodiment of a substrate holder according to the invention.

FIG. 6 shows a fifth embodiment of the substrate holder 1o'''', which can be used by means of control means 8 for a change of the concave mounting surface 18o. The control means 8 may in particular be a mechanical control means
pneumatic control means
hydraulic control means
electrical control means, particularly a piezoelectric element.

In particular, a plurality of control means 8 may be distributed in the substrate holder 1o'''' in order to vary the curvature of the concave mounting surface 18o locally.

Features of the described different substrate holders 1o, 1o', 1o'', 1o''', 1o'''' may be combined with one another, in order to create novel substrate holders according to the invention. Thus, it is conceivable that a substrate holder is created, which combines the bores from the substrate holder 1o'' of FIG. 4 with the material layer 5 of the substrate holder 1o''' of FIG. 5. These combinations are hereby likewise explicitly disclosed.

The different substrates, which are used for the processes and embodiments according to the invention, are illustrated in the further figures. They may be located in particular on the upper substrate holder 1o or lower substrate holder 1u. In particular, however, the substrates 2' and 2'' are termed supports and are preferably located on the lower substrate holder 1u. In the case of a fusion bond, a substrate 2 would also be found on the lower substrate holder.

Figure 7:
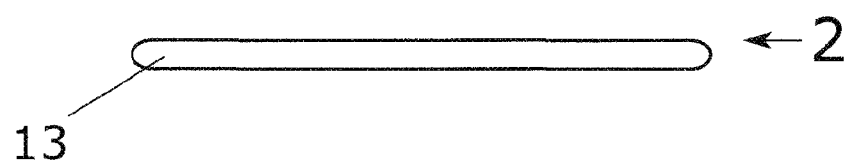
FIG. 7 shows a first embodiment of a substrate.

FIG. 7 shows the simplest embodiment of a substrate 2. The substrate 2 is preferably an unstructured or structured wafer 13.

Figure 8:
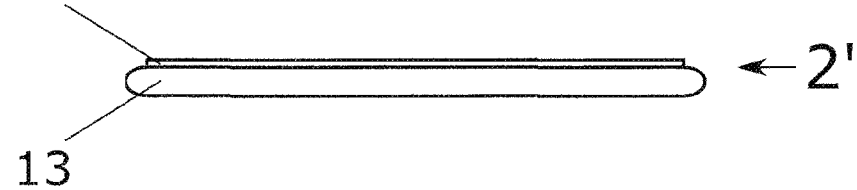
FIG. 8 shows a second embodiment of the substrate.

FIG. 8 shows a substrate 2', comprised of a wafer 13 and an adhesive layer 14. The adhesive layer 14 is preferably a bonding adhesive and is for example applied to the wafer 13 by means of a spin lacquering process.

Figure 9:
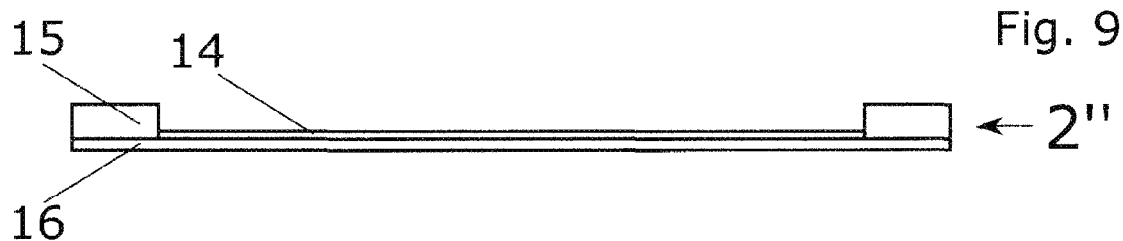
FIG. 9 shows a third embodiment of the substrate.

FIG. 9 shows a substrate 2'', comprised of a film 16, which was stretched onto a frame 15. The film 16 preferably has an adhesive layer 14 on its surface.

REFERENCE LIST 1u, 1o Substrate holder
2, 2u, 2o Substrates
2r, 2r' Side edges
3 Chamber
4 Bores
5 Material layer
7 Fixings
8 Control means
9 Optical elements
10 Bond initiation surface
11 Cavity
12 Chamber space
13 Wafer
14 Adhesive layer
15 Film
16 Frame
17u, 17o Contact surfaces
18u, 18o Mounting surfaces
$v_x, v_y, v_z$ Speeds

What is claimed is:

1. A method for bonding a first substrate to a second substrate at respective contact surfaces of the first and second substrates, said method comprising:
    mounting the first substrate on a first mounting surface of a first substrate holder and mounting the second substrate on a second mounting surface of a second substrate holder, wherein the first and second substrate holders are arranged in a chamber;
    contacting the respective contact surfaces of the first and second substrates at a bond initiation surface;
    bonding the first substrate to the second substrate from a bond initiation surface to the centre of the first and second substrates; and
    increasing a chamber pressure in the chamber:
        (i) after the contacting of the respective contact surfaces of the first and second substrates at the bond initiation surface; and/or
        (ii) during said bonding of the first substrate to the second substrate.

2. The method according to claim 1, wherein the bond initiation surface is circular.

3. The method according to claim 1, wherein the bond initiation surface is arranged at the circumferential edge of at least one of the respective contact surfaces of the first and second substrates.

4. The method according claim 1, wherein:
    prior to the contacting of the respective contact surfaces of the first and second substrates at the bond initiation surface, a concave deformation of the first substrate takes place with respect to the second substrate.

5. The method according to claim 4, wherein the concave deformation of the first substrate takes place with respect to the second substrate by mounting the first substrate on a correspondingly concavely curved first mounting surface.

6. The method according to claim 1, wherein the bond initiation surface is constructed to run in an annular manner.

7. The method according to claim 6, wherein the bond initiation surface runs in a circular manner.

8. A method for bonding a first substrate to a second substrate at respective contact surfaces of the first and second substrates, said method comprising:
    mounting the first substrate on a first mounting surface of a first substrate holder and mounting the second substrate on a second mounting surface of a second substrate holder, wherein the first and second substrate holders are arranged in a chamber:
    contacting the respective contact surfaces of the first and second substrates at a bond initiation surface; and
    bonding the first substrate to the second substrate from a bond initiation surface to the centre of the first and second substrates,
    wherein the bond initiation surface is constructed to run in an annular manner, and
    wherein the bond initiation surface runs concentrically to the centre of the first and second substrates.

9. The method according to claim 1, wherein the bond initiation surface has a closed circumference.

10. The method according to claim 1, wherein the first substrate and/or the second substrate are fixed at a rear on the first mounting surface and/or the second mounting surface.

11. The method according to claim 10, wherein the first substrate and/or the second substrate are fixed at a rear on the first mounting surface and/or the second mounting surfaces, exclusively in a region of side edges of the first and second contact surfaces.

12. A device for bonding a first substrate to a second substrate at respective contact surfaces of the first and second substrates, said device comprising:
- a first mounting surface of a first substrate holder for mounting the first substrate;
- a second mounting surface of a second substrate holder for mounting the second substrate;
- a chamber, in which the first and second substrate holders are arranged;
- means for contacting the respective contact surfaces of the first and second substrates at a bond initiation surface;
- means for bonding the first substrate to the second substrate from the bond initiation surface to the centre of the first and second substrates; and
- means for increasing a chamber pressure in the chamber:
  (i) after the contacting of the respective contact surfaces of the first and second substrates at the bond initiation surface; and/or
  (ii) during said bonding of the first substrate to the second substrate.

* * * * *